United States Patent
Yuge

(10) Patent No.: US 10,937,598 B2
(45) Date of Patent: Mar. 2, 2021

(54) FLEXIBLE ELECTRODE AND SENSOR ELEMENT

(71) Applicant: NEC CORPORATION, Tokyo (JP)

(72) Inventor: Ryota Yuge, Tokyo (JP)

(73) Assignee: NEC CORPORATION, Tokyo (JP)

( * ) Notice: Subject to any disclaimer, the term of this patent is extended or adjusted under 35 U.S.C. 154(b) by 89 days.

(21) Appl. No.: 16/327,664

(22) PCT Filed: Aug. 4, 2017

(86) PCT No.: PCT/JP2017/028379
§ 371 (c)(1),
(2) Date: Feb. 22, 2019

(87) PCT Pub. No.: WO2018/037881
PCT Pub. Date: Mar. 1, 2018

(65) Prior Publication Data
US 2019/0189358 A1     Jun. 20, 2019

(30) Foreign Application Priority Data

Aug. 25, 2016   (JP) .............................. JP2016-164661

(51) Int. Cl.
*G01L 1/00*          (2006.01)
*H01G 5/011*        (2006.01)
(Continued)

(52) U.S. Cl.
CPC .............. *H01G 5/011* (2013.01); *B82Y 30/00* (2013.01); *B82Y 40/00* (2013.01); *C01B 32/182* (2017.08);
(Continued)

(58) Field of Classification Search
CPC ...... H01G 5/011; H01G 11/36; C01B 32/182; B82Y 30/00; B82Y 40/00; G01B 7/22;
(Continued)

(56) References Cited

U.S. PATENT DOCUMENTS 6,836,424 B2 * 12/2004 Segal .................... B82Y 10/00
                                                      257/E21.582
7,361,430 B1 * 4/2008 Gennett ................ B81B 3/0021
                                                      310/300
(Continued)

FOREIGN PATENT DOCUMENTS

JP        2012-054192 A    3/2012
JP            5570353 A    8/2014
(Continued)

OTHER PUBLICATIONS

Ryota Yuge et al., "Preparation and Characterization of Newly Discovered Fibrous Aggregates of Single-Walled Carbon Nanohorns", Advanced Materials, May 25, 2016, pp. 7174-7177, vol. 28, No. 33.

(Continued)

*Primary Examiner* — Max H Noori
(74) *Attorney, Agent, or Firm* — Sughrue Mion, PLLC

(57) ABSTRACT

A flexible electrode is provided in which an increase in resistance change rate caused by repeated stretch is reduced. A sensor element is also provided, which uses the flexible electrode. A strain sensor, a pressure sensor, and a temperature sensor are also provided, each using the sensor element. The flexible electrode can include an insulating flexible substrate and an electrode film laminated on the flexible substrate. The electrode film can include a fibrous carbon nanohorn aggregate.

16 Claims, 4 Drawing Sheets

(51) Int. Cl.
*H01C 17/065* (2006.01)
*B82Y 30/00* (2011.01)
*H01C 7/00* (2006.01)
*B82Y 40/00* (2011.01)
*H01G 11/36* (2013.01)
*C01B 32/182* (2017.01)
*G01B 7/16* (2006.01)
*G01L 1/14* (2006.01)
*H05K 1/02* (2006.01)

(52) U.S. Cl.
CPC ............... *G01B 7/22* (2013.01); *G01L 1/146* (2013.01); *H01C 7/00* (2013.01); *H01C 17/065* (2013.01); *H01G 11/36* (2013.01); *H05K 1/0277* (2013.01)

(58) Field of Classification Search
CPC ......... G01L 1/146; H01C 7/00; H01C 17/065; H05K 1/0277
USPC .......................................................... 73/774
See application file for complete search history.

(56) References Cited

U.S. PATENT DOCUMENTS

| | | | |
|---|---|---|---|
| 7,745,810 B2 * | 6/2010 | Rueckes | H01L 51/0003 257/4 |
| 2010/0329494 A1 * | 12/2010 | Rouvala | H04R 1/2803 381/338 |
| 2014/0111063 A1 * | 4/2014 | Bae | H01L 41/0477 310/339 |
| 2015/0184333 A1 * | 7/2015 | Arai | |
| 2016/0377409 A1 | 12/2016 | Norisada et al. | |
| 2017/0167928 A1 | 6/2017 | Lee et al. | |
| 2018/0105425 A1 * | 4/2018 | Yuge | H01G 11/86 |

FOREIGN PATENT DOCUMENTS

| | | |
|---|---|---|
| JP | 2015-041419 A | 3/2015 |
| WO | 2015/079951 A1 | 6/2015 |
| WO | 2015/119211 A1 | 8/2015 |
| WO | 2016/147909 A1 | 9/2016 |
| WO | 2016/208170 A1 | 12/2016 |
| WO | 2017/159351 A1 | 9/2017 |

OTHER PUBLICATIONS

Ryota Yuge et al., "Structure and Electrical Properties of Fibrous Aggregates of Carbon Nanohorns", Extended Abstracts of the 63rd JSAP Spring Meeting 2016, Mar. 3, 2016, pp. 14-115, 21a-S421-6.
International Search Report for PCT/JP2017/028379 dated Nov. 7, 2017 [PCT/ISA/210].

* cited by examiner

Fig. 4
Fig. 4(a)
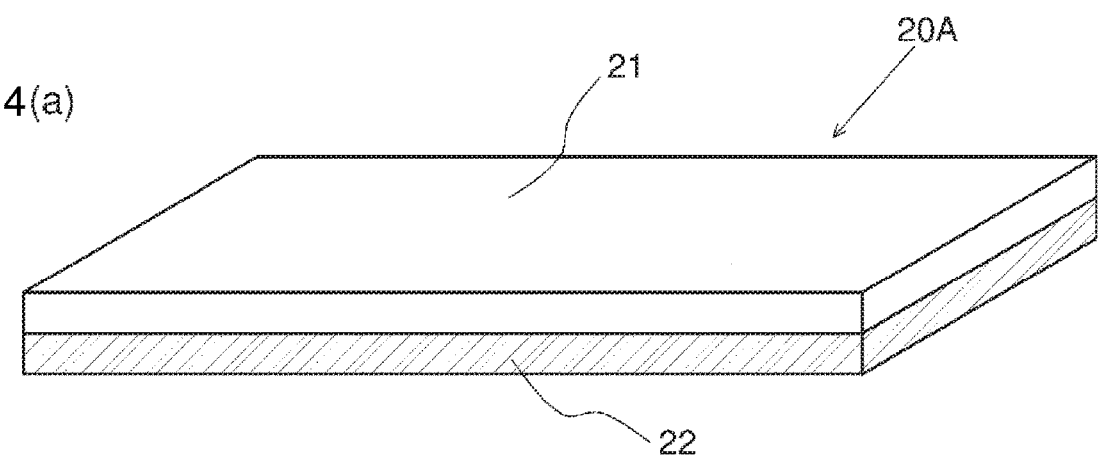
Fig. 4(b)
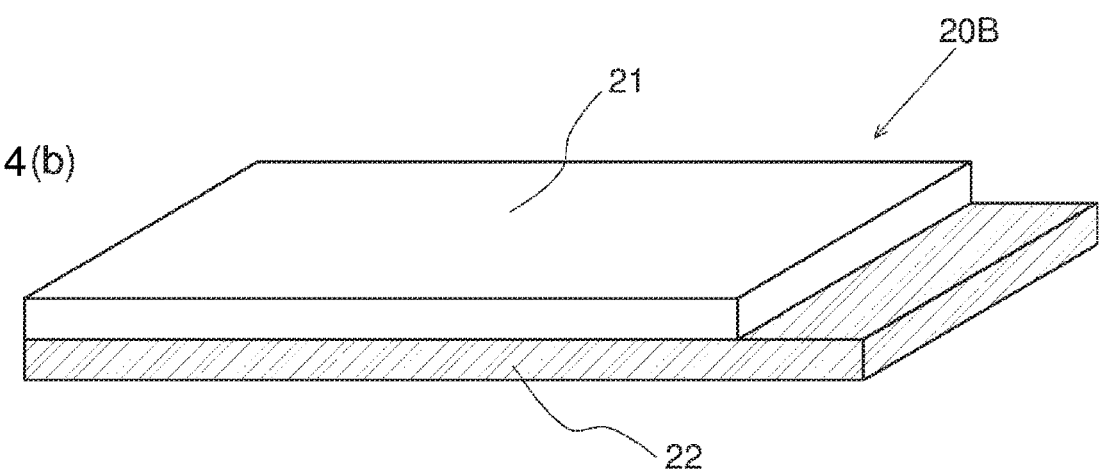
Fig. 4(c)
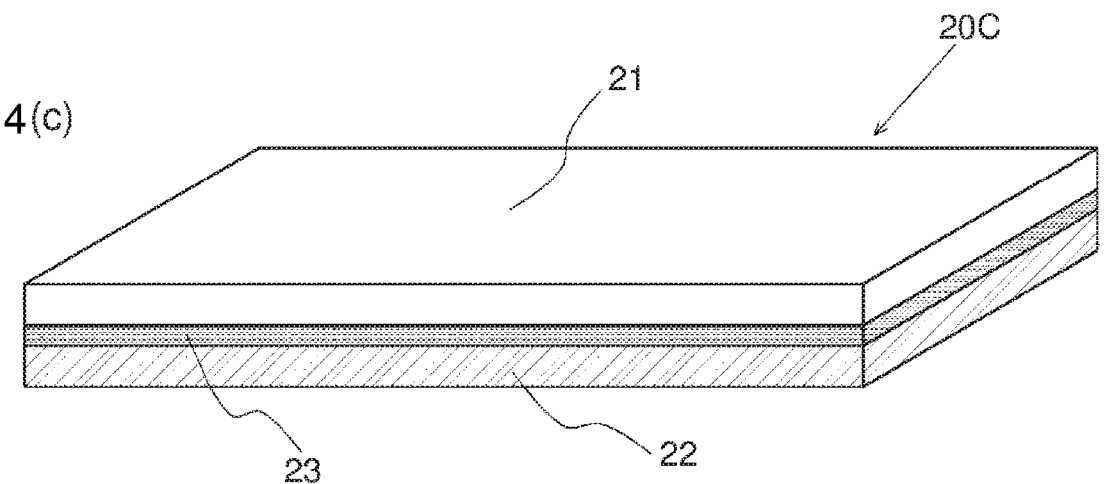

FLEXIBLE ELECTRODE AND SENSOR ELEMENT

CROSS REFERENCE TO RELATED APPLICATIONS

This application is a National Stage of International Application No. PCT/JP2017/028379 filed Aug. 4, 2017, claiming priority based on Japanese Patent Application No. 2016-164661 filed Aug. 25, 2016, and the disclosure thereof is entirely incorporated herein.

TECHNICAL FIELD

The present invention relates to a flexible electrode and a sensor element comprising the flexible electrode.

BACKGROUND ART

In recent years, the development of wearable devices with the aim of application to health monitoring and the like has been actively conducted. However, since metal foil type and semiconductor type sensors currently in widespread use lack flexibility, a new sensor element having flexible electrodes that can be stretched and can detect human movement and health condition has been required.

Patent Literature 1 discloses a wiring obtained by mixing a polyurethane dispersion liquid and conductive particles, applying the mixture to a flexible substrate and drying the mixture, as a stretchable flexible electrode.

Patent Literature 2 discloses an electrode that can suppress the occurrence of increases and variations in electrical resistance when repeatedly stretched by forming an electrode body using a mixture of single-walled carbon nanotubes and multi-walled carbon nanotubes on an elastomer substrate.

CITATION LIST

Patent Literature

Patent Literature 1: Japanese Patent No. 5570353
Patent Literature 2: JP2015-41419A

SUMMARY OF INVENTION

Technical Problem

The stretchable electrode disclosed in Patent Literature 2 irreversibly increases resistance by repeated stretch since nanotubes tend to reaggregate.

The present invention has been conducted in view of the above circumstances, and the object thereof is to provide a flexible electrode which reduces an increase in resistance change rate by repeated stretch and a sensor element including the flexible electrode.

Solution to Problem

The flexible electrode of the present invention includes an insulating flexible substrate and an electrode film including a fibrous carbon nanohorn aggregate stacked on the flexible substrate.

Advantageous Effects of Invention

The present invention can provide a flexible electrode which reduces an increase in resistance change rate by repeated stretch and a sensor element comprising the flexible electrode.

BRIEF DESCRIPTION OF THE DRAWINGS

FIGS. 4(a)-4(c) are perspective views of a flexible electrode according to one Example embodiment.

EXAMPLE EMBODIMENTS

Figure 1:
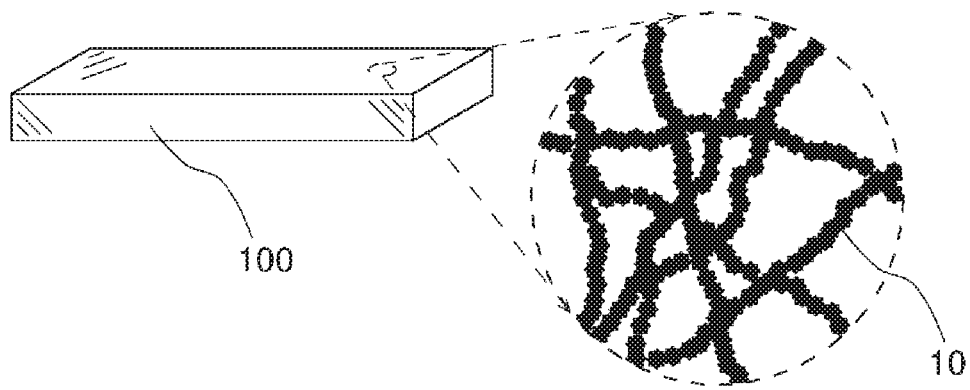
FIG. 1 is a perspective view and a schematic enlarged view of an electrode film according to one Example embodiment.

Example embodiments will be described with reference to the drawings. FIG. 1 is a perspective view and a schematic enlarged view of the electrode film 100 including the fibrous carbon nanohorn aggregate 10 according to one example embodiment. As shown in the enlarged view, the electrode film 100 has a three-dimensional conduction path formed by the fibrous carbon nanohorn aggregate 10.

The fibrous carbon nanohorn aggregate 10 has a structure in which carbon nanohorn aggregates of a seed type, a bud type, a dahlia type, a petal dahlia type, and a petal type (a graphene sheet structure) are connected. The seed type is a shape in which almost no or no angular protrusions are observed on the surface of the fibrous structure, the bud type is a shape in which angular protrusions are observed somewhat on the surface of the fibrous structure, the dahlia type is a shape in which many angular protrusions are observed on the surface of the fibrous structure, and the petal type is a shape in which petal-like protrusions (graphene sheet structure) are observed on the surface of the fibrous structure. One or more of these carbon nanohorn aggregates are included in the fibrous structure.

The carbon nanohorn aggregate (spherical carbon nanohorn aggregate) is formed by a seed type, a bud type, a dahlia type, a petal dahlia type, and a petal type alone or in combination. The seed type is a shape in which almost no or no angular protrusions are observed on the surface of the spherical aggregate, the bud type is a shape in which angular protrusions are observed somewhat on the surface of the spherical aggregate, the dahlia type is a shape in which many angular protrusions are observed on the surface of the spherical aggregate, and the petal type is a shape in which petal-like protrusions are observed on the surface of the spherical aggregate. The petal structure has a width of 50 to 200 nm, a thickness of 0.34 to 10 nm, and 2 to 30 graphene sheet structures. The petal dahlia type is an intermediate structure between the dahlia type and the petal type.

The diameter of each single-walled carbon nanohorn constituting the fibrous and spherical carbon nanohorn aggregates is approximately 1 nm to 5 nm and the length is 30 nm to 100 nm.

The fibrous carbon nanohorn aggregate can have a diameter of about 30 nm to 200 nm and a length of about 1 μm to 100 μm.

The fibrous carbon nanohorn aggregate has particularly preferably a long structure having a large aspect ratio (fiber length/diameter), and the aspect ratio is desirably 10 or more. This is also the same as in FIGS. 2 and 3 described below.

A method for preparing a fibrous carbon nanohorn aggregate will be described. Carbon that contains a metal catalyst such as Fe, Ni, or Co is used as a target (referred to as a catalyst-containing carbon target). While rotating the target in a chamber in which the catalyst-containing carbon target is placed, the target is heated by laser ablation in a nitrogen atmosphere, an inert atmosphere, hydrogen, carbon dioxide, or a mixed atmosphere and is then evaporated. A mixture of fibrous carbon nanohorn aggregates and spherical carbon nanohorn aggregates is obtained during the process of cooling evaporated carbon and catalyst. The fibrous carbon nanohorn aggregate is separated from the obtained mixture by centrifugation, separation based on a difference in sedimentation rate after dispersion in a solvent, gel permeation chromatography, and the like.

Adjusting the kind and the flow rate of the atmospheric gas can suitably change the form and size of the carbon nanohorn aggregate produced.

A pure (100%) graphite target free of a catalyst was used in the preparation of a spherical carbon nanohorn aggregate. However, since the fibrous carbon nanohorn aggregate is prepared by evaporating the carbon target containing the catalytic metal as described above, the catalytic metal is present inside or outside the fibrous carbon nanohorn aggregate.

In addition to the laser ablation method, an arc discharge method or a resistance heating method can be used. The laser ablation method is more preferable from the viewpoint of possible continuous generation at room temperature and atmospheric pressure.

A fibrous carbon nanohorn aggregate has a structure in which radially extending horn structures are connected. For this reason, even when the electrode film 100 stretches or deforms, variation in electrical resistance is small, and it is difficult for the conductive path to be cut. It is difficult for the fibrous carbon nanohorn aggregate to reaggregate, leading to high stability even when the electrode film 100 is repeatedly stretched or deformed.

A paste using a spherical carbon nanohorn aggregate tends to reaggregate when the thin film is dried and thus a problem is that it is difficult to form a uniform thin film. However, it is difficult for the fibrous carbon nanohorn aggregate to reaggregate, allowing formation of a more uniform thin film. The conductivity is improved as compared with the electrode film using the spherical carbon nanohorn aggregate.

Figure 2:
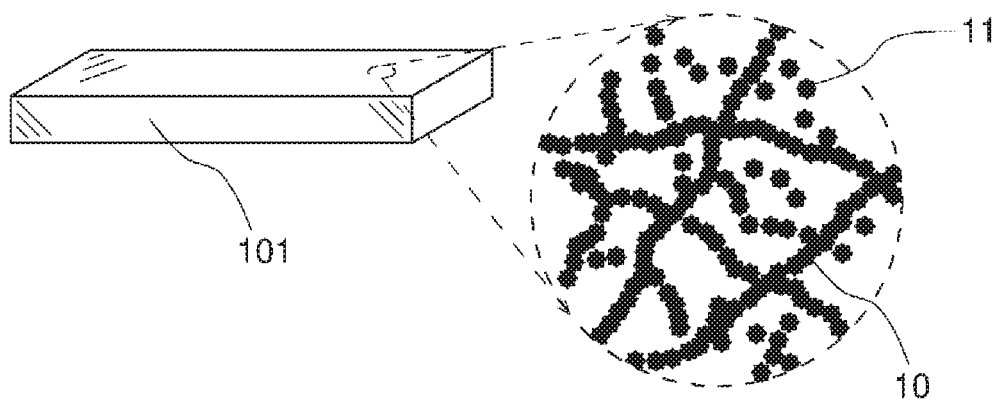
FIG. 2 is a perspective view and a schematic enlarged view of an electrode film according to one Example embodiment.

FIG. 2 is a perspective view and an enlarged view of the electrode film 101 in which the spherical carbon nanohorn aggregate 11 is mixed in the fibrous carbon nanohorn aggregate 10.

The spherical carbon nanohorn aggregate has a diameter of about 30 nm to 200 nm and is almost uniform in size.

The ratio between the fibrous carbon nanohorn aggregate 10 and the spherical carbon nanohorn aggregate 11 in the electrode film 101 can be appropriately adjusted. When the mass of the entire electrode film is taken as 100 mass %, the proportion of the fibrous carbon nanohorn aggregate 10 is preferably 5 mass % or more and 80 mass % or less, more preferably 10 mass % or more and 70 mass % or less.

Since the spherical carbon nanohorn aggregate 11 is mixed with the fibrous carbon nanohorn aggregate 10, the number of contact points is further increased. The stability of the electrode film 101 against stretch and deformation is thus improved. In addition, the rate of resistance change due to repeated distortion can be reduced. Since the spherical carbon nanohorn aggregate 11 can be generated at the same time as the fibrous carbon nanohorn aggregate 10, the preparation by a low-cost process is possible.

When a mixture of the fibrous carbon nanohorn aggregate 10 and the spherical carbon nanohorn aggregate 11 is used, dispersibility is improved as compared with the case of using a mixture of the carbon nanotube and the spherical carbon nanohorn aggregate 11.

Figure 3:
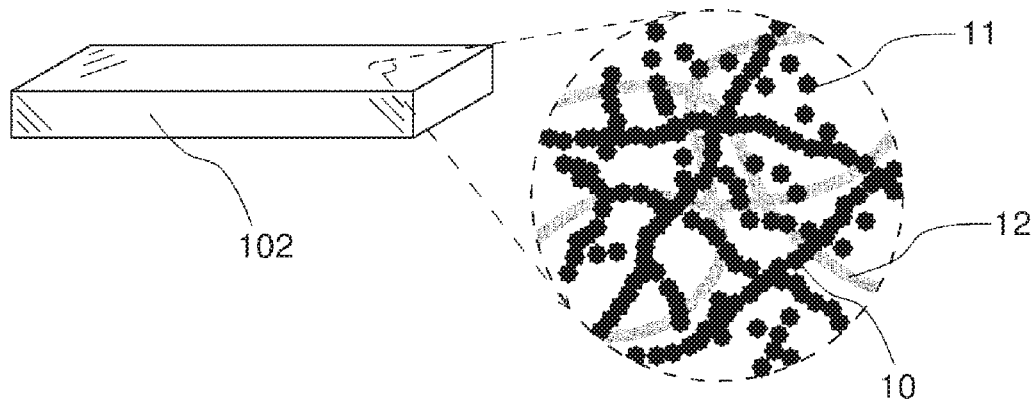
FIG. 3 is a perspective view and a schematic enlarged view of an electrode film according to one Example embodiment.

FIG. 3 is a perspective view and an enlarged view of the electrode film 102. In the electrode film 102, the fibrous carbon nanohorn aggregate 10, the spherical carbon nanohorn aggregate 11, and the carbon nanotube 12 are mixed.

In the electrode film 102, the ratio among the fibrous carbon nanohorn aggregate 10, the spherical carbon nanohorn aggregate 11, and the carbon nanotube 12 can be appropriately adjusted. When the mass of the entire electrode film is 100 mass %, the proportion of the carbon nanotube 12 is preferably 5 mass % or more and 50 mass % or less.

For the carbon nanotube, a single layer, a double layer, or a multilayer nanotube can be appropriately used.

The carbon nanotube particularly preferably has a long structure with a large aspect ratio (fiber length/diameter). The carbon nanotube desirably has an aspect ratio of 100 or more.

The fibrous carbon nanohorn aggregate 10 and the spherical carbon nanohorn aggregate 11 are highly dispersible, thus allowing preparation of a good electrode even with the nanotube 12 having low dispersibility. This effect greatly improves the conductivity of the electrode film itself due to the high conductivity of the carbon nanotube itself.

Nanocarbons except for the carbon nanotube may be mixed with the fibrous carbon nanohorn aggregate 10 or together with the spherical carbon nanohorn aggregate 11 in the electrode film shown in FIGS. 1 to 3. Examples of nanocarbons except for the carbon nanotube include carbon black (for example, furnace black (trade name "Ketjen Black" manufactured by Lion Corporation), channel black, acetylene black, and thermal black), and graphene (single layer or multiple layers). As the electrode film, the fibrous carbon nanohorn aggregate, a mixture of the fibrous carbon nanohorn aggregate and the spherical carbon nanohorn aggregate, and a nanocarbon mixture of the same and at least one of the carbon nanotube, the carbon black, and the graphene can be used.

As described above, the fibrous carbon nanohorn aggregate has high dispersibility unlike the conventional fibrous material. The electrode film using the fibrous carbon nanohorn aggregate tends not to reaggregate after the shape is deformed. The electrode film particularly has not only the excellent stability when repeatedly stretched or deformed and but also the easy handling of the material thereof. The fibrous carbon nanohorn aggregate and the spherical carbon nanohorn aggregate have radially extending horn structure to obtain many contact points and thus a good three-dimensional conductive path, providing a flexible electrode in which the change (variation) in electrical resistance and the cut of the conductive path hardly occur in the deformation.

It is also possible to use the fibrous carbon nanohorn aggregate or the spherical carbon nanohorn aggregate in which fine holes are formed (opening). The opening can be formed by oxidation treatment. This oxidation treatment forms a surface functional group containing oxygen at the opening portion. The oxidation treatment can use gas phase process and liquid phase process. In the case of the gas phase process, air, oxygen, carbon dioxide can be used as atmospheric gas, and air is suitable from the viewpoint of cost. The temperature can be in the range of 300 to 650° C., and 400 to 550° C. is more suitable. At less than 300° C., almost no carbon burns, and the opening cannot be obtained. At 650° C. or more, the entire carbon nanohorn aggregate will burn and cannot be used. In the case of the liquid phase process, nitric acid, sulfuric acid, hydrogen peroxide, and the like can be used. Nitric acid can be used in the temperature range from room temperature to 120° C. At 120° C. or more, unpreferably, the oxidizing power is too high and most of the carbon nanohorn aggregate is oxidized. Hydrogen peroxide can be used in the temperature range from room temperature to 100° C. At 40° C. or less, unpreferably, the oxidizing power is very weak and almost no oxidization occurs. In liquid phase reaction, light irradiation is also more effective.

Metal catalyst existing inside or outside the fibrous and spherical carbon nanohorn aggregates can be dissolved and removed in nitric acid, sulfuric acid, and hydrochloric acid. From the viewpoint of ease of use, hydrochloric acid is suitable. The temperature at which the metal catalyst is dissolved can be appropriately selected. Desirably, the metal catalyst is sufficiently removed at 70° C. or more. Since the metal catalyst may be covered with the carbon coating at the time of generating the carbon nanohorn aggregate, pretreatment is desirable. As pretreatment, it is desirable to heat the fibrous carbon nanohorn aggregate is desirable to be heated in air at about 250 to 450° C.

Crystallinity can be improved by heat treating the prepared fibrous carbon nanohorn aggregate and spherical carbon nanohorn aggregate in an inert gas, hydrogen, and vacuum. The heat treatment can be carried out in the temperature range of 800 to 2000° C., and the temperature range is preferably 1000 to 1500° C.

The surface functional group containing oxygen are formed at the opening portions of the fibrous carbon nanohorn aggregate and the spherical carbon nanohorn aggregate after the opening treatment. The above surface functional group can be removed by heat treatment. The heat treatment can be carried out in the temperature range of 150 to 2000° C. Removing the carboxyl group, the hydroxyl group, and the like desirably requires 150 to 600° C. For the carbonyl group and the like, 600° C. or more is desirable. The surface functional group can be removed by reduction. Hydrogen can be used for reduction under a gaseous atmosphere. Hydrazine and the like can be used under a liquid atmosphere.

FIGS. 4(a)-4(c) are perspective views showing a configuration of the flexible electrode 20 according to one Example Embodiment. In the flexible electrode 20A of FIG. 4 (a), the electrode film 21 is laminated on the insulating flexible substrate 22. Any one of the electrode films 100, 101, and 102 is used as the electrode film 21.

FIG. 4(b) is a perspective view showing a configuration of the flexible electrode 20B which is a modified example of the flexible electrode 20. As shown in FIG. 4(b), the electrode film 21 and the substrate 22 may have different lengths. As shown in FIG. 4(c), the adhesive layer 23 may be disposed between the substrate 22 and the electrode film 21. Disposing the adhesive layer 23 improves adhesiveness.

Figure 5:
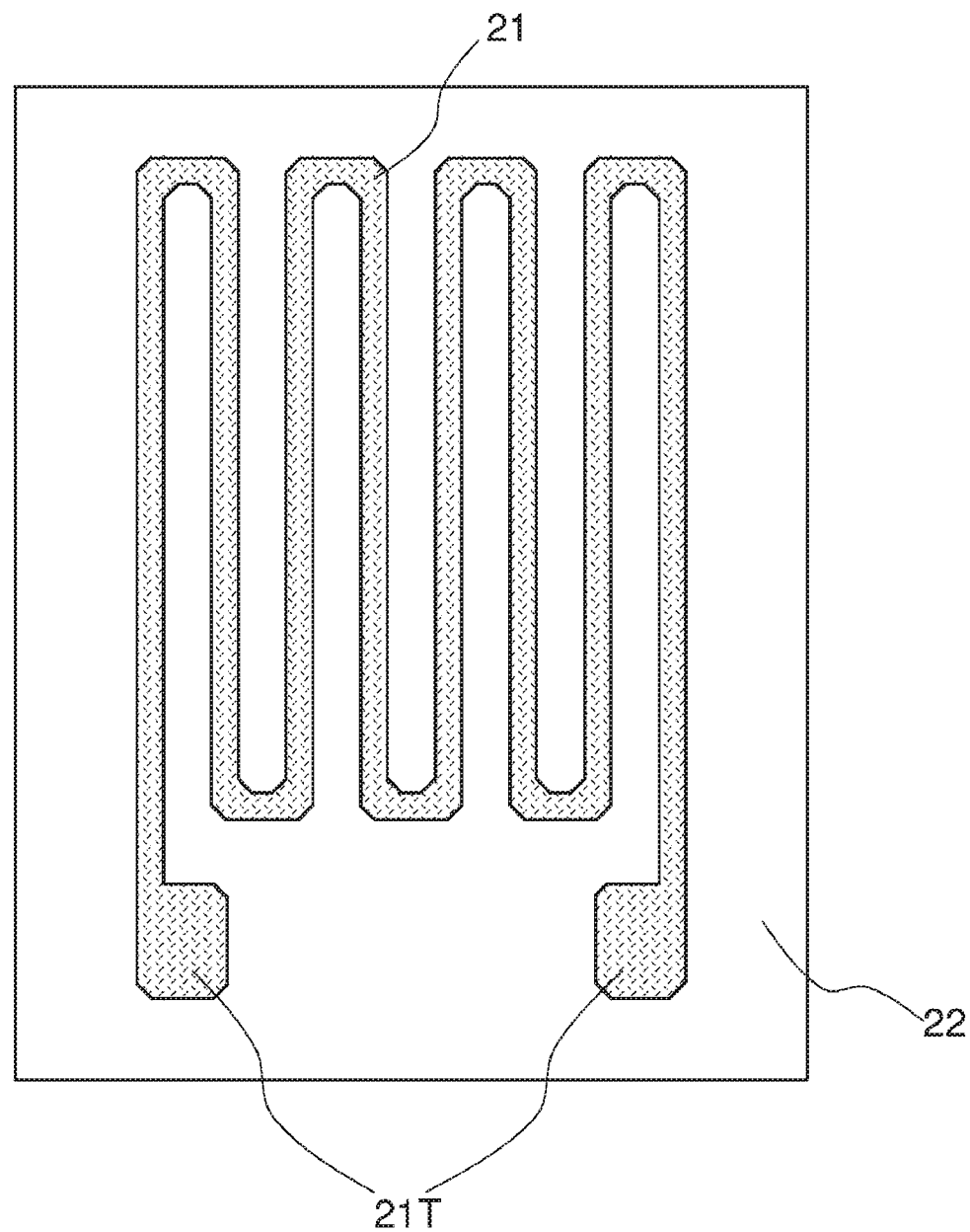
FIG. 5 is a top view of a flexible electrode according to one Example embodiment.

In addition to the above, the shape and size can be appropriately changed depending on the application, and the electrode film 21 can also be formed in the form of a thin line pattern as shown in FIG. 5 in order to increase the current path length on the substrate 22 having a predetermined area. Increasing the current path length increases the resistance change rate even with slight deformation of the flexible electrode and improves sensitivity when the flexible film is used for sensors and the like. In FIG. 5, the terminal forming portion 21T having the widened area is provided at both end portions of the thin line pattern of the electrode film 21, but the present invention is not limited thereto.

A concave portion may be formed on the surface of the electrode film 21 side in the substrate 22 so that a part or the whole of the electrode film 21 is embedded in the substrate 22.

The flexible electrode 20 can be deformed following the surface shape of various articles and can also be used in a bent state.

The mixture of the fibrous carbon nanohorn aggregate and the spherical carbon nanohorn aggregate can be formed into a thin film without a binder and has good adhesion to the substrate, but the electrode film may include a binder component. The present invention can reduce the amount of a binder as compared with the conventional carbon material and suppress the decrease in conductivity due to the increase in the amount of a binder. On the other hand, using the binder component can improve the adhesion to the substrate, the strength of the electrode film itself, and the stability of an electrode liquid paste.

The spherical carbon nanohorn aggregate has a spherical structure, providing higher dispersibility in a solution than that of a carbon nanotube. This allows easier preparation of a uniform paste than with a carbon nanotube. The mixture of the fibrous carbon nanohorn aggregate and the spherical carbon nanohorn aggregate also has high dispersibility in a solution. As a result, mixing is easy in a solution and a uniform paste can be easily prepared, thus allowing preparation of the electrode by a low-cost process.

As a binder component, silicone rubber, urethane rubber, fluororubber, butyl rubber, ethylene propylene rubber, polyethylene, chlorosulfonated polyethylene, natural rubber, isoprene rubber, butadiene rubber, polystyrene, styrene-butadiene rubber, acrylic rubber, nitrile rubber, polyvinyl acetate, polyvinyl chloride, polymethyl methacrylate, and the like can be used, and these can be used singly or in combinations of two or more.

The content of a binder can be appropriately selected as long as conductivity can be ensured and is preferably 0.1 to 50 mass % based on the total mass of the electrode film.

The above electrode film may contain various additives besides nanocarbon such as a carbon nanohorn aggregate and a carbon nanotube and a binder component. Examples of the additives include a crosslinking agent for a binder component, a vulcanization accelerator, a vulcanization aid, a plasticizer, and a softening agent.

As a substrate, any material can be used as long as the material has insulating properties and flexibility, and one including an elastomer having elasticity are particularly preferable. As an elastomer, silicone rubber, polydimethylsiloxane, urethane rubber, natural rubber, isoprene rubber, nitrile rubber, ethylene-propylene rubber, styrene-butadiene rubber, butadiene rubber, fluororubber, and acrylic rubber can be used, and these can be used singly or in combinations of two or more. The material having insulating properties and flexibility such as various resin films can also be used as a substrate. Formation of a thin electrode film on a transparent substrate can provide a flexible electrode having light transmittance. A substrate is not limited to one layer and may have a multilayer configuration of two or more layers. As the insulating properties, the volume resistivity is preferably $1.0 \times 10^7$ Ωcm or more.

Various known additives may be added to the substrate as long as the effect of the present invention is not impaired. Examples thereof include a filler, a plasticizer, a chain extender, a crosslinking agent, an ultraviolet absorber, an antioxidant, an oxidation inhibitor, a coloring agent, a fungicide, and a flame retardant.

When the shape of the electrode film is a layered shape as shown in FIG. 1, the thickness of the electrode film is desirably 0.1 µm to 5 mm. Sufficient conductivity can be obtained at 0.1 µm or more. The electrode film is not excessively hardened at a thickness of 5 mm or less, and the flexible electrode has sufficient elasticity and flexibility.

The above adhesive layer is used for intimately adhering the electrode film and the substrate and can be appropriately selected depending on the application thereof. The thickness of the adhesive layer can be 5 nm to 10 µm for use, desirably 10 nm to 1 µm.

(Method for Manufacturing Flexible Electrode)

The flexible electrode according to the Example Embodiment can be manufactured as follows:

(1) A step of forming an electrode paste using: a fibrous carbon nanohorn aggregate; or a fibrous carbon nanohorn aggregate and the spherical carbon nanohorn aggregate; or a fibrous carbon nanohorn aggregate, a spherical carbon nanohorn aggregate, and a nanocarbon; and (2) A step of applying the electrode paste to an insulating flexible substrate and drying the electrode paste.

The electrode paste includes a dispersion medium and the fibrous carbon nanohorn aggregate. The electrode paste may further include the spherical carbon nanohorn aggregate or a nanocarbon such as a carbon nanotube. Examples of the dispersion medium include toluene, propylene carbonate, dimethylacetamide, methyl isobutyl ketone, alcohols, and water.

The sensor element according to the present invention is constituted by attaching a terminal for measuring the electric resistance of the electrode film to the above flexible electrode. The terminal can be formed by vapor deposition, sputtering, paste coating, and the like using a highly conductive metal (e.g., copper, silver, and gold).

The sensor element according to the Example Embodiment can be applied to a strain sensor, a pressure sensor, and a temperature sensor. Any sensor thereof utilizes the resistance change of the electrode film due to deformation of the flexible electrode. Each sensor may have one sensor element or a plurality of sensor elements. Each sensor may have a protective film for protecting the electrode film and the terminal. Each sensor may have various circuits such as CMOS.

The strain sensor can be attached to the surface of the measurement object and can measure the resistance change when the flexible electrode deforms by bending or stretch in conformity with the distortion of the measurement object. The pressure sensor can measure the resistance change due to deformation when the electrode film is pushed into the substrate side and can also be applied to a touch panel and the like. The temperature sensor can detect the temperature change by fixing the flexible electrode between members with different coefficients of thermal expansion and by changing the resistance when the flexible electrode stretches due to the thermal expansion difference due to the temperature of both members.

As described above, according to the present Example embodiment, the fibrous carbon nanohorn aggregate is excellent not only in conductivity but also in dispersibility, and thus a uniform conductive paste can be easily obtained. In addition, an electrode film in which reaggregation hardly occurs can be obtained.

By utilizing such an electrode film comprising the fibrous carbon nanohorn aggregate having high conductivity and high dispersibility, a flexible electrode excellent in elasticity, flexibility, and stability during repeated stretch can be obtained.

EXAMPLES

Hereinafter, Examples will be shown, and the present invention will be exemplified and described in more detail. Naturally, the invention is not limited by the following Examples.

(Manufacturing Example of Fibrous Carbon Nanohorn Aggregate)

In a nitrogen atmosphere, a carbon target containing about 5 mass % of iron was irradiated with a $CO_2$ laser to prepare a fibrous carbon nanohorn aggregate and a spherical carbon nanohorn aggregate. Specifically, the carbon target containing iron was rotated at 2 rpm. The energy density of the $CO_2$ laser was continuously irradiated at 150 kW/cm$^2$, and the chamber temperature was a room temperature. In the chamber, the gas flow rate was adjusted to be 10 L/min. The pressure was controlled to 933.254 to 1266.559 hPa (700 to 950 Torr). As a result of observation with SEM, the fibrous substance had a diameter of about 30 to 100 nm and a length of several µm to several tens of µm, and most of the spherical substance had a substantially uniform size in the range of about 30 to 200 nm in diameter. The obtained fibrous and spherical carbon nanohorn aggregates were a mixture of carbon nanohorn aggregates of a seed type, a bud type, a dahlia type, and a petal dahlia type.

In addition, the mixture of the obtained fibrous carbon nanohorn aggregate and spherical carbon nanohorn aggregate was separated by centrifugation, and a sample of only the fibrous carbon nanohorn aggregate was provided.

Example 1

Figure 6:
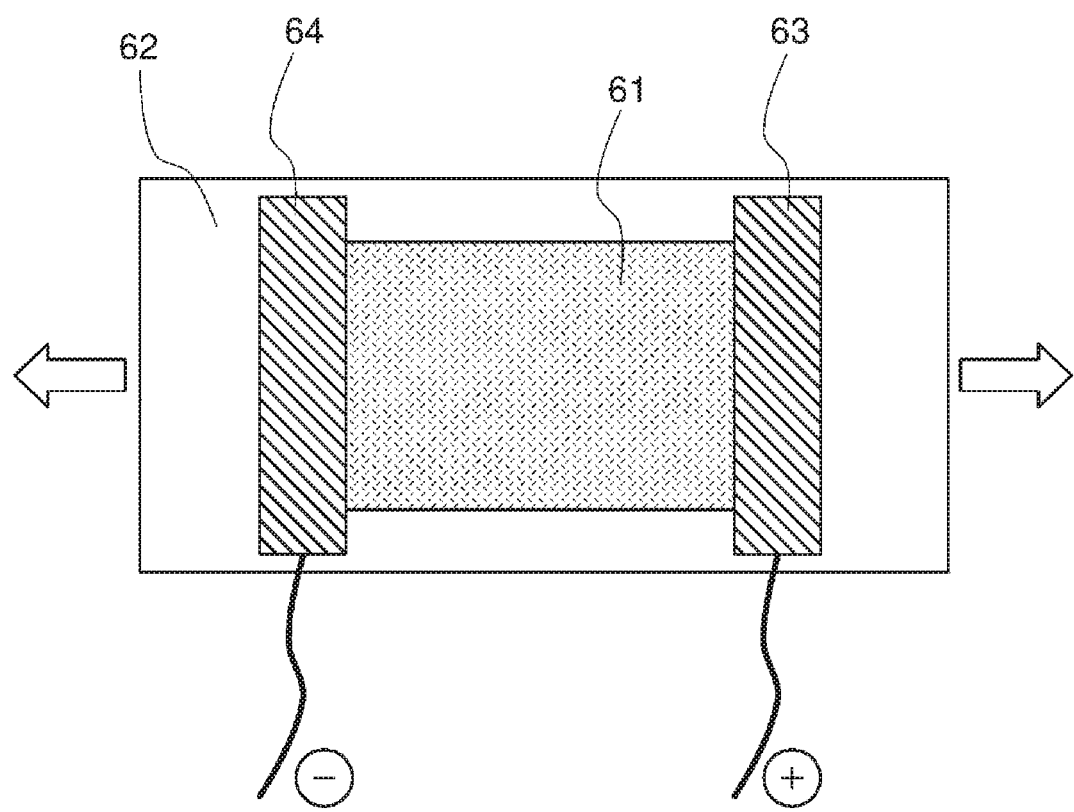
FIG. 6 is a plan view for explaining an evaluation method of a flexible electrode in Examples.

The mixture (50 mg) of the fibrous carbon nanohorn aggregate and the spherical carbon nanohorn aggregate was added to 50 mg of methyl isobutyl ketone and subjected to ultrasonic dispersion treatment for 1 hour. The mixture was further mixed with stirring at 2000 rpm for 3 minutes to prepare a paste. The obtained paste was applied to a 0.5 mm thick substrate manufactured by using polydimethylsiloxane (PDMS) and dried to obtain a flexible electrode having an electrode film with a thickness of 20 µm. As shown in FIG. 6, the electrode terminals 63 and 64 were attached to both ends of the electrode film 61, and the substrate 62 was stretched. In the measurement, the resistance changes in the cycle of pulling until the strain to the substrate reached 5% and then relaxing the strain was measured. It was confirmed that the resistance increased by applying strain and the resistance decreased by relaxing the strain. Table 1 shows the resistance change rate ($\Delta R/R_0$) after 2, 3, and 20 times of strain application when the resistance value before strain application (initial) is $R_0$ and the difference between the resistance values before and after stretch after strain application is $\Delta R$. The resistance value at the time of stretching once from the condition of no stretch was different from the resistance values at and after the second time. The resistance values stably changed at and after the second time. This is because the fibrous carbon nanohorn aggregate and the spherical carbon nanohorn aggregate in the electrode film 61 moved to a stable position by the first stretch. The following description will be made using the stably changing resistance values at and after the second time. It was found from Example 1 that stable resistance change with little variation in stretch was exhibited.

Examples 2 to 3 and Comparative Example 1

In the same manner as in Example 1, the electrode film (Example 2) having only the fibrous carbon nanohorn aggregate; the electrode film (Example 3) of a mixture of the fibrous carbon nanohorn aggregate, the spherical carbon nanohorn aggregate, and a carbon nanotube (average fiber diameter: 20 nm and average length: 50 µm); and the electrode film of only a carbon nanotube (Comparative Example 1) were prepared on the substrate of PDMS, and the same measurement as in Example 1 was carried out. In Comparative Example 1, variations in the resistance change were large, and the resistance change rate further increased with an increase in the number of cycles. The resistance change during the cycle in Example 2 was larger than that in Example 1, but the variation had no problem. Example 3 had substantially the same characteristics as Example 1. In addition, the resistance value in measurement became small. This is because the carbon nanotube was dispersed by the fibrous carbon nanohorn aggregate or the spherical carbon nanohorn aggregate and conductive path worked effectively.

TABLE 1

|  | $\Delta R/R_0$ | | |
| --- | --- | --- | --- |
|  | After 2 times | After 3 times | After 20 times |
| Example 1 | 0.41 | 0.40 | 0.42 |
| Example 2 | 0.48 | 0.54 | 0.57 |
| Example 3 | 0.40 | 0.45 | 0.43 |
| Comparative Example 1 | 0.80 | 0.95 | 1.15 |

INDUSTRIAL APPLICABILITY

The flexible electrode according to the Example Embodiment can be applied to various wearable devices with the aim of application to health monitoring and the like and is suitable as a sensor that can detect a health condition such as human movement, pulse, respiration rate, vital capacity, or body temperature.

The present invention has been described with reference to the Example Embodiments and Examples, but the present invention is not limited to the above described Example Embodiments and Examples. Various changes that can be understood by those skilled in the art within the scope of the present invention can be made to the constitution and details of the present invention.

A part or all of the above Example Embodiments may also be written as the following supplemental notes but is not limited thereto.

[Supplemental Note 1]
A flexible electrode comprising:
an insulating flexible substrate; and
an electrode film comprising a fibrous carbon nanohorn aggregate and being laminated on the flexible substrate.

[Supplemental Note 2]
The flexible electrode according to Supplemental Note 1, wherein the fibrous carbon nanohorn aggregate is an aggregate in a fibrous state of a single-layer carbon nanohorn having a diameter of 1 nm to 5 nm and a length of 30 nm to 100 nm, and a horn-shaped tip and the fibrous carbon nanohorn aggregate has a diameter of 30 nm to 200 nm and a length of 1 µm to 100 µm.

[Supplemental Note 3]
The flexible electrode according to Supplemental Note 1 or 2, wherein the fibrous carbon nanohorn aggregate is one in which a carbon nanohorn aggregate of at least one of a seed type, a dahlia type, a bud type, a petal dahlia type, and a petal type is connected in a fibrous state.

[Supplemental Note 4]
The flexible electrode according to any one of Supplemental Notes 1 to 3, wherein the electrode film further comprises a spherical carbon nanohorn aggregate of at least one of a seed type, a bud type, a dahlia type, a petal dahlia type, and a petal type.

[Supplemental Note 5]
The flexible electrode according to any one of Supplemental Notes 1 to 4, wherein the electrode film further comprises at least one nanocarbon of a carbon nanotube, carbon black, and graphene.

[Supplemental Note 6]
The flexible electrode according to any one of Supplemental Notes 1 to 5, wherein the flexible substrate comprises an elastomer.

[Supplemental Note 7]
A method for manufacturing a flexible electrode, comprising:
preparing a paste comprising a fibrous carbon nanohorn aggregate and
applying the paste to an insulating flexible substrate and drying the paste to form an electrode film

[Supplemental Note 8]
The method for manufacturing a flexible electrode according to Supplemental Note 7, wherein the fibrous carbon nanohorn aggregate is an aggregate in a fibrous state of a single-layer carbon nanohorn having a diameter of 1 nm to 5 nm and a length of 30 nm to 100 nm, and a horn-shaped tip and the fibrous carbon nanohorn aggregate has a diameter of 30 nm to 200 nm and a length of 1 µm to 100 µm.

[Supplemental Note 9]
The method for manufacturing a flexible electrode according to Supplemental Note 7 or 8, wherein the fibrous carbon nanohorn aggregate is one in which a carbon nanohorn aggregate of at least one of a seed type, a dahlia type, a bud type, a petal dahlia type, and a petal type is connected in a fibrous state.

[Supplemental Note 10]
The method for manufacturing a flexible electrode according to any one of Supplemental Notes 7 to 9, wherein the paste further comprises a spherical carbon nanohorn aggregate of at least one of a seed type, a bud type, a dahlia type, a petal dahlia type, and a petal type.

[Supplemental Note 11]
The method for manufacturing a flexible electrode according to any one of Supplemental Notes 7 to 10, wherein the paste further comprises at least one of a carbon nanotube, carbon black, and graphene.

[Supplemental Note 12]
The method for manufacturing a flexible electrode according to any one of Supplemental Notes 7 to 11, wherein the flexible substrate comprises an elastomer.

[Supplement 13]

A sensor element comprising the flexible electrode according to any one of Supplemental Notes 1 to 6.

[Supplement 14]

A strain sensor comprising at least one sensor element according to Supplemental Note 13.

[Supplement 15]

A pressure sensor comprising at least one sensor element according to Supplemental Note 13.

[Supplement 16]

A temperature sensor comprising at least one sensor element according to Supplemental Note 13.

REFERENCE SIGNS LIST

10 Fibrous carbon nanohorn aggregate
11 Spherical carbon nanohorn aggregate
12 Carbon nanotube
100, 101, 102 Electrode film
21 Electrode film
22 Substrate
23 Adhesive layer

The invention claimed is:

1. A flexible electrode comprising:
an insulating flexible substrate; and
an electrode film comprising a fibrous carbon nanohorn aggregate and being laminated on the flexible substrate.

2. The flexible electrode according to claim 1, wherein the fibrous carbon nanohorn aggregate is an aggregate in a fibrous state of a single-layer carbon nanohorn having a diameter of 1 nm to 5 nm and a length of 30 nm to 100 nm, and a horn-shaped tip and the fibrous carbon nanohorn aggregate has a diameter of 30 nm to 200 nm and a length of 1 μm to 100 μm.

3. The flexible electrode according to claim 1, wherein the fibrous carbon nanohorn aggregate is one in which a carbon nanohorn aggregate of at least one of a seed type, a dahlia type, a bud type, a petal dahlia type, and a petal type is connected in a fibrous state.

4. The flexible electrode according to claim 1, wherein the electrode film further comprises a spherical carbon nanohorn aggregate of at least one of a seed type, a bud type, a dahlia type, a petal dahlia type, and a petal type.

5. The flexible electrode according to claim 1, wherein the electrode film further comprises at least one nanocarbon of a carbon nanotube, carbon black, and graphene.

6. The flexible electrode according to claim 1, wherein the flexible substrate comprises an elastomer.

7. A sensor element comprising the flexible electrode according to claim 1.

8. A strain sensor comprising at least one sensor element according to claim 7.

9. A pressure sensor comprising at least one sensor element according to claim 7.

10. A temperature sensor comprising at least one sensor element according to claim 7.

11. A method for manufacturing a flexible electrode, comprising:
preparing a paste comprising a fibrous carbon nanohorn aggregate and
applying the paste to an insulating flexible substrate and drying the paste to form an electrode film.

12. The method for manufacturing a flexible electrode according to claim 11, wherein the fibrous carbon nanohorn aggregate is an aggregate in a fibrous state of a single-layer carbon nanohorn having a diameter of 1 nm to 5 nm and a length of 30 nm to 100 nm, and a horn-shaped tip and the fibrous carbon nanohorn aggregate has a diameter of 30 nm to 200 nm and a length of 1 μm to 100 μm.

13. The method for manufacturing a flexible electrode according to claim 11, wherein the fibrous carbon nanohorn aggregate is one in which a carbon nanohorn aggregate of at least one of a seed type, a dahlia type, a bud type, a petal dahlia type, and a petal type is connected in a fibrous state.

14. The method for manufacturing a flexible electrode according to claim 11, wherein the paste further comprises a spherical carbon nanohorn aggregate of at least one of a seed type, a bud type, a dahlia type, a petal dahlia type, and a petal type.

15. The method for manufacturing a flexible electrode according to claim 11, wherein the paste further comprises at least one of a carbon nanotube, carbon black, and graphene.

16. The method for manufacturing a flexible electrode according to claim 11, wherein the flexible substrate comprises an elastomer.

* * * * *